United States Patent [19]
Shen et al.

[11] Patent Number: 5,723,385
[45] Date of Patent: Mar. 3, 1998

[54] WAFER EDGE SEAL RING STRUCTURE

[75] Inventors: Chih-Heng Shen, Hsin-Chu; Hui-Tzu Lin, Taichung, both of Taiwan

[73] Assignee: Taiwan Semiconductor Manufacturing Company, Ltd, Hsin-Chu, Taiwan

[21] Appl. No.: 767,007

[22] Filed: Dec. 16, 1996

[51] Int. Cl.$^6$ .............. H01L 21/4763; H01L 23/02; H01L 23/29; H01L 23/31

[52] U.S. Cl. .............. 438/763; 438/703; 438/782; 438/783; 257/618; 257/758

[58] Field of Search .................. 438/703, 761, 438/763, 782, 783, 790, 978, 694; 257/618, 620, 758; 148/DIG. 28

[56] References Cited

U.S. PATENT DOCUMENTS

| | | | |
|---|---|---|---|
| 5,425,846 | 6/1995 | Koze et al. | 156/646 |
| 5,426,073 | 6/1995 | Imaoka et al. | 438/597 |
| 5,593,925 | 1/1997 | Yamaha | 438/703 |

*Primary Examiner*—Jerome Jackson
*Assistant Examiner*—John Guay
*Attorney, Agent, or Firm*—George O. Saile; Stephen B. Ackerman

[57] ABSTRACT

A wafer edge seal ring structure is disclosed to provide reduced particulate contaminant generation during wafer processing of high density integrated circuits. The structure is formed by delimiting the deposition of layers at the peripheral edges of wafers. It is shown that as each layer is deposited and then essentially trimmed back from the edge of the wafer through a judicious use of mask and etching, and/or edge-bead rinsing (EBR) and later sealed by wafer edge exposure (WEE), the otherwise present abnormal growth of layers are prevented from building up into protrusions at the edge of wafer that later peel or break up to form particulate matter and fine dust. The method, which is also disclosed, teaches how each layer is recessed at appropriate distances from the wafer edge and how the whole ring structure is sealed against attacking particles.

24 Claims, 3 Drawing Sheets

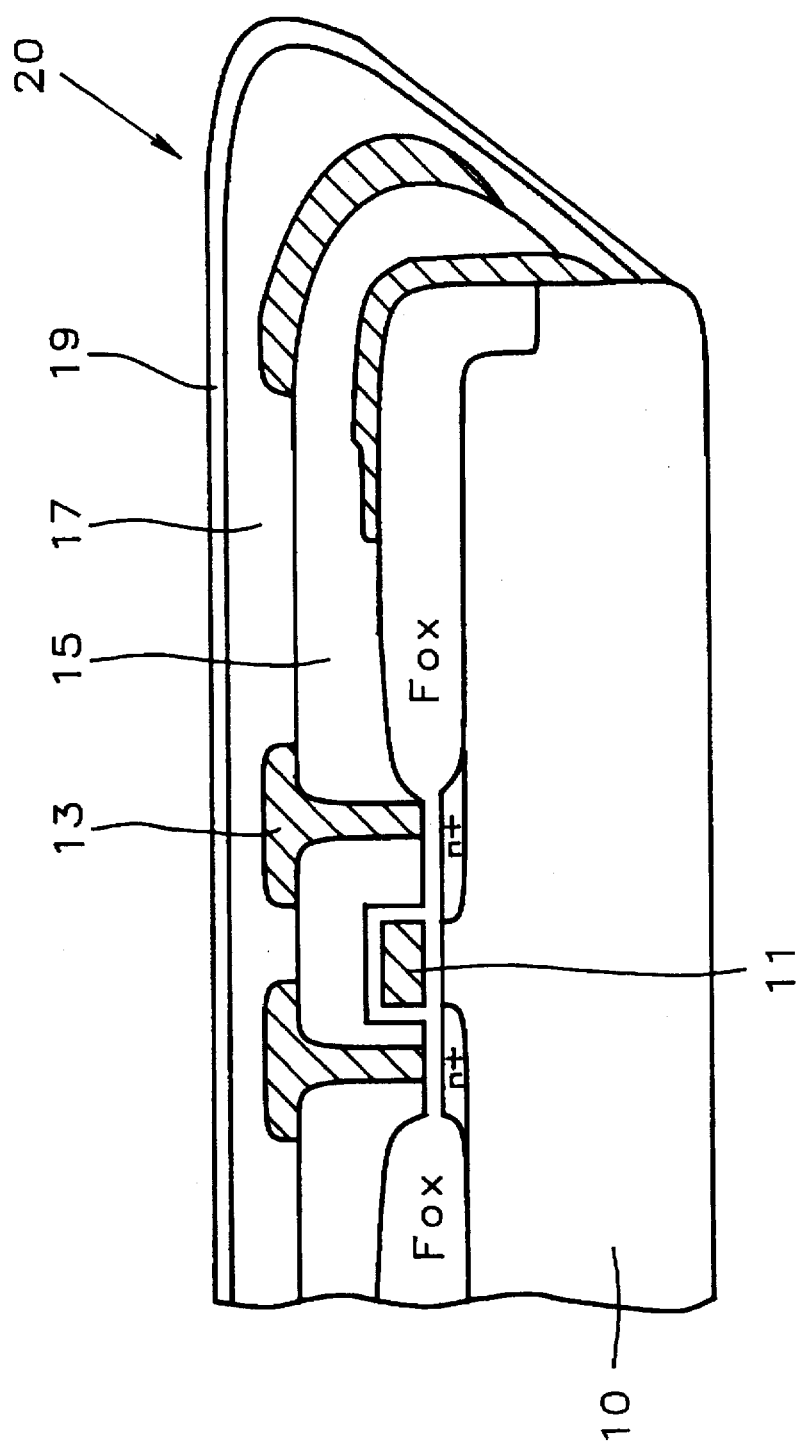
FIG. 1a – Prior Art

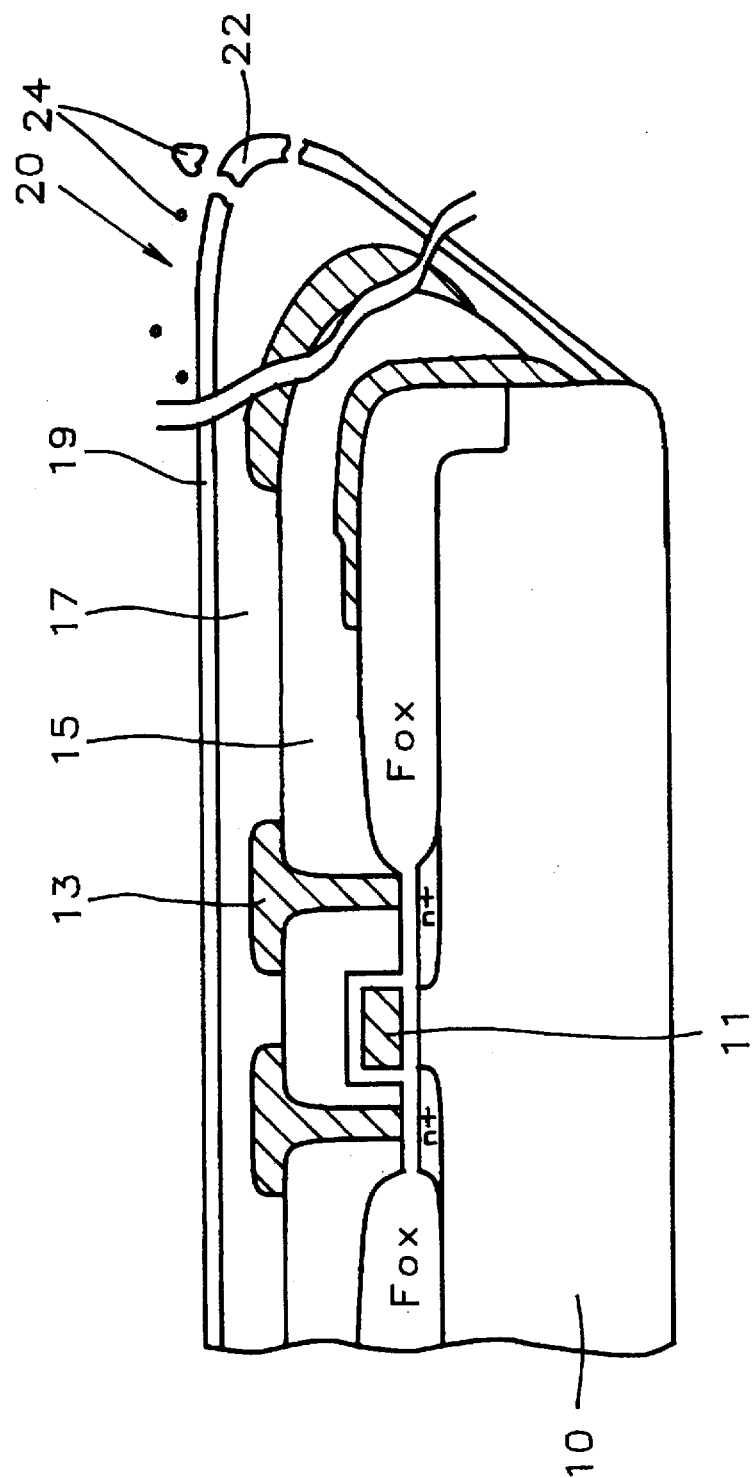
FIG. 1b – Prior Art

WAFER EDGE SEAL RING STRUCTURE

BACKGROUND OF THE INVENTION

1. Field of the Invention

The present invention relates in general to semiconductor manufacturing, and in particular, to the design of a seal-ring like structure at wafer edge to eliminate problems caused by the formation of complex layers at the edge.

2. Description of the Related Art

Manufacturing of semiconductor substrates encompasses hundreds of different process steps. The steps involve creating patterns, introducing dopants, and depositing films on a silicon substrate repetitively throughout the manufacturing process to form integrated structures. Because the various structures that are built on a substrate or a wafer are serial in nature, that is, that they are built one on top of another in a sequential manner, it becomes very important that each layer of structure is substantially defect free before the next one is placed thereon.

Defects are generally caused when an unwanted particulate matter unintentionally lands between features on a layer and "bridges" or connects them, and therefore, disables them by "shorting" under certain conditions; or when an unwanted particulate matter lands on a feature, and disables it by creating an unwanted "open" in the circuitry. The size of the particulates in relation to the size of the features play an important role in creating the defects. As the size of features in today's high density integrated circuit chips (IC) are getting miniaturized ever so incessantly, control over the size of contaminants introduced into the manufacturing line need also be scrutinized diligently if acceptable levels of yield are to be maintained. Thus, for submicron lithographic technologies where the wiring features or patterns are less than one micrometer, μm, in width, the size of the invading particulate matter need be controlled to between about one fifth to one tenth of the width, or between about 0.1–0.25 μm. With chip sites of about 5 mm×5 mm on a wafer, or of an area of 25 mm$^2$, the allowable defect density is about 0.02 pieces/mm$^2$ in order to achieve satisfactory levels of yield. For larger chip areas on the order of 100 mm$^2$, the defect density must be below 0.003 pieces/mm$^2$ in order to achieve the same yield.

Defects can best be avoided if the sources of the contaminants or dust particles are eliminated. There are mainly two major sources for contaminants that are introduced into a manufacturing line: the first one is that which resides outside the work piece, namely the wafer, such as the ambient air surrounding the wafer, or fluids, such as chemicals, that are brought to the work piece for various processes that take place at the work-station. These contaminants that are external to the work piece and sometimes are known as "drop-ons", can generally be kept away from the work-piece by proper use of filters, and other implements that are commonly available. The other source for particle contaminants is the work piece itself, and the contaminants generated from the work-piece is sometimes referred to as being "process-induced." As work is being performed on the work-piece, the work-piece releases particulate matter, or dust, due to abrasion or breakage caused by excessive stresses imposed on certain parts of the work-piece. A case in point is when a wafer, for example, is clamped down or held on the edges by wafer holders, tweezers and the like. As expected, they are usually the corners, edges, and other such places on the work-piece that are subjected to large stresses resulting from their small areas.

Due to the complexity of piling structure at wafer edge, the breakage at the edge becomes more pronounced because of the various different layers of materials that are deposited in building the structure on silicon or other semiconductor substrates. Furthermore, since the properties of the materials vary considerably from layer to layer, such as for example, from metals for interconnection layers, to different types of dielectrics for interlevel layers, the nature of breakage of each one of the materials vary from each other, and consequently, the size of the particulate matter that are released as a result of such breakages also varies. In prior art, several attempts have been made to control the amount of such breakage as explained below.

A common approach for controlling the amount of breakage or peeling from the edge of a wafer has been to chamfer the edge. This chamfering or rounding off the edge of the substrate in advance, prior to performing the subsequent process steps has been successful in reducing particles that would be generated from the substrate edge itself. Special techniques such as disclosed in U.S. Pat. No. 5,425,846 have been developed to remove material from the periphery of wafers for this purpose. Usually, the substrate at this stage has already built in it the needed semiconductor elements such as transistors, etc. However, as other layers are deposited on the substrate during the remaining steps, the resulting multi-layered structure becomes susceptible to peeling or breakage at the edge because of being exposed to handling at the edge. In high density, highly integrated IC's, there may be in excess of ten such layers, each differing in material properties. The difference in the properties exacerbates the peeling and breakage due to the difference in the thermal coefficient of expansion, and the adhesion characteristics of one material with respect to the other, and so on. The layered materials can be as diverse as a polycrystalline for a semiconductor layer, a silicon dioxide or silicon nitride for an insulating interlevel layer, or aluminum as a metal interconnecting layer. Depending upon their particular material properties, the behavior of each one these layers vary as a function of the location on a wafer as they are deposited on the wafer. Thus, when dielectric spin-on-glass, SOG, is spun on a wafer, it forms a bead as it advances towards the edge of the wafer. Similarly, some other materials exhibit an abnormal, or thicker growth towards the edge of the wafer. As additional layers are deposited on the wafer, the irregular growths on the edge reinforce each other, thus resulting in a bulbous protrusion which is shown as item (20) in FIG. 1.

Briefly, FIG. 1 is a cross section of a silicon substrate (10) containing MOS-type field effect transistors, or MOSFETs defined by field oxide fields surrounding n+ doped regions, and a polycrystalline gate (11) which are formed by methods well known in the art and as they are not significant to the invention, will not be described in detail here. Before the first metal layer (13) is blanket deposited over the whole wafer and patterned by etching, an interlevel dielectric layer (15), such as a phospho-silicate glass, or PSG, is also blanket deposited covering the whole wafer and etched to form holes to accept metal as connection between levels, all being accomplished by using conventional methods and techniques. The metal layer is then covered by another dielectric interlevel layer, such as spin-on-glass, SOG (17).

It will be observed from FIG. 1a thus far that as each layer is deposited, there is a bulge or hump of that layer within the vicinity of the edge of the wafer. The bulge is especially pronounced when spinning on SOG (17) in the liquid form, and this behavior can be explained in terms of the phenomenon of hydraulic jump encountered in hydrodynamics of fluids, but not discussed here. A number of additional metal interconnect layers may be formed on wafer (10) in the manner described here by depositing alternately metal and dielectric interlevel layers. It will be appreciated that as more layers are formed, more bulging will occur and the now larger bulbous region (20) will be subjected to more increased local stresses during wafer handling, thus resulting in peeling or breakage at the edge of the wafer as depicted in FIG. 2a. For completeness, a silicon nitride layer (19) is also shown in FIGS. 1a and 2a as the final passivation layer deposited in the final step of sealing the wafer from the environment. That also breaks away into small pieces and forms fine dust particles (22), (24) of different sizes as shown in FIG. 2a.

In another approach to reduce the amount of dust particles generated by the wafer itself, a circumferential portion of layers near the edge of the wafer are removed by grinding or etching until the underlying wafer is exposed. As disclosed in U.S. Pat. No. 5,426,073, the removal of the deposited material on the wafer edge reduces dust generation that would have been caused by cracking or abrasion of the same. The wafer edge grinding is accomplished such that the bulbous protrusion (20) of the deposited layers does not remain thereon, and is shaped round an mirror-finished, according to a chamfering process for general semiconductor wafers. After the grinding step, abrasive powder sticking to the wafer or particles of the ground-off wafer, etc., are completely washed away with deionized water. Finally, for providing the mirror finish of the wafer edge, an additional etching step is employed.

In either one of the approaches of grinding and mirror polishing the wafer edge, and/or the subsequent layers deposited on the wafer, it will be appreciated by those skilled in the art that, the mere fact of grinding the materials still introduces dust particles into the manufacturing line. What is needed, therefore, is a method for eliminating, in the first place, the source of the particles, namely, the layers of materials at the peripheral extremities of the wafer, as disclosed in the present invention.

SUMMARY OF THE INVENTION

It is therefore an object of this invention to provide a wafer edge seal ring structure that reduces particulate contaminant generation during wafer processing of high density integrated circuits.

It is another object of this invention to provide a method for forming a wafer edge seal ring structure that reduces particulate contaminant generation during wafer processing of high density integrated circuits.

It is another object of this invention to provide a method for delimiting the deposition of layers at the peripheral edge of wafers.

It is another object of this invention to provide a method for preventing the peeling and breakage of layers near the edge of wafers.

It is still another object of this invention to provide an improved method for reducing particulate contaminant generation during wafer processing of high density integrated circuits.

It is yet another object of this invention to provide a method for improving yields in the manufacture of high density integrated circuits.

In accordance with the afore-mentioned objects, there is provided a wafer edge seal ring structure comprising a substrate having semiconductor devices; a first interlevel dielectric formed with a recessed edge from edge of said wafer; a first metal layer formed with a recessed edge from edge of said wafer; a second interlevel interlevel dielectric formed with a recessed edge from edge of said wafer; a second metal layer formed with a recessed edge from edge of said wafer; and a passivation layer covering said wafer structure.

In accordance with the afore-mentioned objects, there is also provided a method for depositing a first interlevel dielectric on a substrate having semiconductor devices; forming a recessed edge of said first interlevel dielectric at a first perimeter of wafer edge; depositing a first metal layer; patterning the first metal layer to form an edge at a second perimeter of wafer edge; depositing a second interlevel dielectric over the first metal and forming a second recessed edge of said second interlevel dielectric at an intermediate perimeter of wafer edge; repeating said process for additional layers of metal and interlevel dielectric layers and forming corresponding edges recessed from wafer edge; and covering said wafer structure with a passivation layer as a final step.

BRIEF DESCRIPTION OF THE DRAWINGS

FIG. 1a is a cross-section of a prior art wafer showing the abnormal growth of layers at the edge of said wafer.

FIG. 1b shows how the growth of FIG. 1a results in conventional breakage and formation of dust particles.

DESCRIPTION OF THE PREFERRED EMBODIMENTS

Figure 2A:
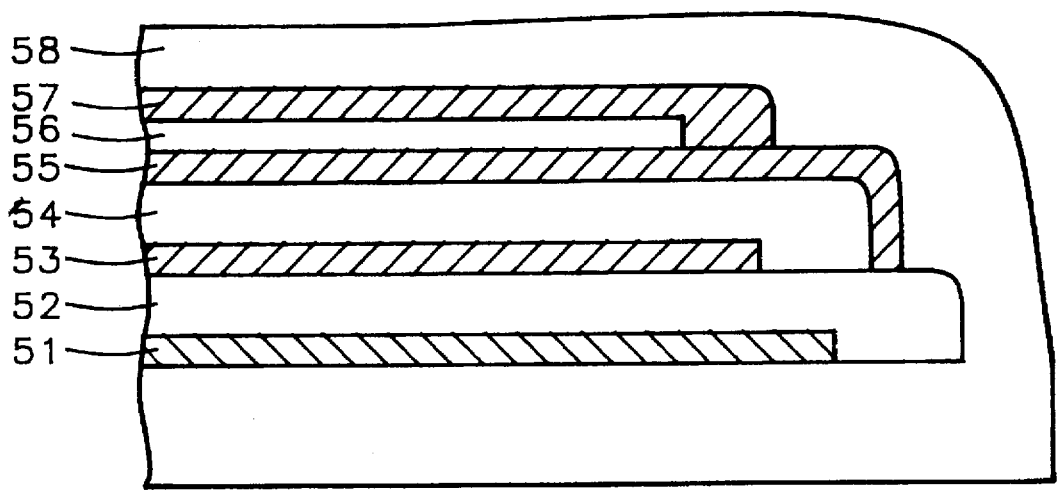
FIG. 2a is a cross-section of a wafer showing the forming of layers recessed from the edge of said wafer according to this invention.
Figure 2B:
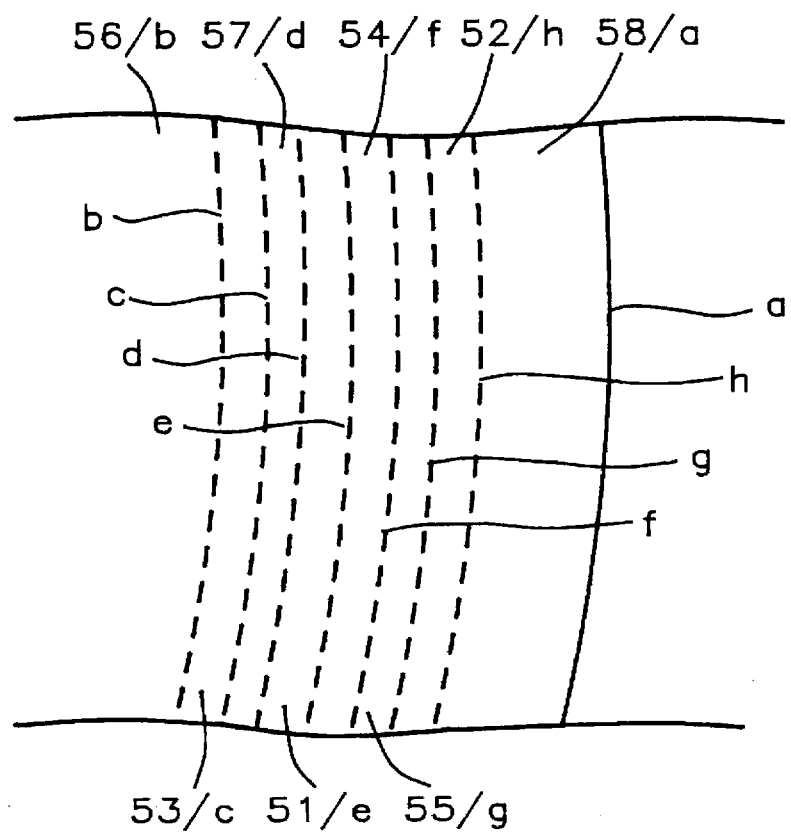
FIG. 2b is a top plan view of said wafer in FIG. 2a showing the arrangement of recessed layers near the edge of the wafer.

Referring now to the drawings, in particular to FIGS. 2a and 2b, there are shown cross-sectional and top plan views, respectively, of a wafer processed according to the principles of the present invention. In FIG. 2a, substrate (10), preferably silicon, is shown starting with a polycrystalline silicon (PolySi) film (51) which is deposited to form a gate electrode over a region where an integrated circuit element such as a transistor, diode or resistor is to be formed. The subsequent steps of patterning the PolySi to form gate structures, doping through windows opened by the previous step of patterning, annealing to form source and drain regions for a MOSFET device, all accomplished according to well known semiconductor processing techniques, will not be described in detail here in order not to unnecessarily obscure the present invention.

The disposition of PolySi layer (51) as shown in FIG. 2a, however, depicts a main feature and key spirit of the present invention; namely that, the hump near the edge of the substrate that results from the abnormal growth—as observed in prior art and explained earlier in section on Related Art—of the thickness of PolySi during deposition is removed—according to this invention—during the patterning step of the PolySi. That is, the outer edge of layer (51) is recessed at a circumferential perimeter (e) inside the substrate edge (a), and it is preferred that the distance between said substrate edge (a) and PolySi edge (e) is between about 1.6 to 2.0 mm. (It will be noted that as an aid to distinguish the various perimeters shown in FIG. 2b with the corresponding layers in FIG. 2a, the perimeter labels are also given alongside numerals indicating the layers).

It will be appreciated by those skilled in the art that the incorporation of a pattern corresponding to a ring of width of about said 2 mm at the outer edge of substrate (10) will make it not possible to cause breakage or peeling of layer (51) at edge (a). It will also be appreciated that in the absence of layer (51) extending to the outer edge of substrate (10), the subsequent deposition of the next layer of interlevel dielectric (52) onto layer (51) will not promote abnormal growth of layer (52) since layer (52) will be contacting the smooth surface of the underlying wafer surface that is exposed for about 2 mm from perimeter (e) of layer (51) to the edge (a) of the wafer. However, when interlevel dielectric (52), preferably a boron and phosphorus doped film, is deposited by the decomposition of tetraethyl orthosilicate (BPTEOS), any irregular growth that occurs towards the edge of the substrate is again removed to prevent any build up for the next layer (53). The removal of layer (52) from edge (a) of wafer to perimeter (h) shown in FIG. 2b is accomplished by well known etching techniques at the same time the holes are made in the dielectric layer for interlevel connections. It is preferred that the distance between substrate edge (a) and BP-TEOS edge (h) is between about 1.0 to 1.5 mm and that the interlevel dielectric layer (52) cover edge (e) of the underlying PolySi (51).

In the embodiment disclosed so far, the edge of substrate (10) is made free of any abnormal growth or hump without the introduction of any dust particles, that is without the necessity of having to grind the edge of the substrate. Normally, in prior art, using a thick photoresist film as a protective coating after the step of depositing interlevel layer (52), layers (52), (51) and silicon dioxide layers (not shown) underlying layer (51) are ground off together so that any abnormally grown protrusions of the deposited layers do not remain thereon. As expected, the grinding process introduces particulate contaminants, and finer dust particles into the manufacturing line with concomitant detrimental effects on defective parts and product yield.

The effectiveness of delimiting the deposition of layers at the peripheral edges of wafers so as to prevent the formation of abnormal growth becomes even more apparent as the number of layers are increased upwards of three or metal layers as dictated by today's ultra large scale integrated (ULSI) semiconductor technology. At the same time, the same ULSI technology is demanding larger chips and therefore larger wafers for improved productivity. As the wafer sizes go beyond 100 mm in diameter, the protrusions formed on the outer edge become that much more amenable to breakage because of the added weight of the larger dimensions. The dust particles so generated are usually difficult to remove from around work-pieces inasmuch as the airborne particles are carried from one place to another easily, and stick onto substrate surfaces, filling patterns areas, trenches and scribe lines that may be present on a wafer.

Referring to FIG. 2a again, a first metal layer (53), preferably aluminum-copper, is deposited over layer (52). The metal layer is then patterned using known methods, while incorporating on the same mask an additional pattern of a ring having a perimeter (c) at a distance of between about 2.5 to 3.1 mm from substrate edge (a) as shown in FIG. 2b. Next, a plasma enhanced chemical vapor (PECVD) oxide is deposited as a second interlevel dielectric layer (54) covering the previous metal layer (53) and then etched to form a recessed perimeter (f) at a distance 2.0 to 2.6 mm from wafer edge (a) as shown in FIG. 2b. In the preferred mode, layer (54) is a sandwich type structure alternating between spin-on-glass (SOG) and PECVD oxide, and it covers metal layer (53) totally, including edge (c) of the latter layer. Second metal layer (55) in turn is deposited and patterned in the same manner as with first metal layer (53), but with perimeter (g) at a distance between 1.5 to 2.0 mm from edge (a) in FIG. 2b. It is critical that second metal layer (55) caps the underlying layer (54) to prevent peeling of the latter during subsequent handling of the wafer.

Layer (56) in FIG. 2a is SOG which is spun on second metal layer (55) using conventional techniques covering the whole surface of substrate (10). In one embodiment of this invention, the bulbous growth, sometimes referred to as the edge-bead, of SOG towards the edge of the wafer is removed by rinsing the edge with solvent EL-100. The edge-bead rinse (EBR) is carried out by directing the solvent at the edge of the wafer where the bead has formed, and until the bead is removed at perimeter (b) at a distance of 3.0 to 3.5 mm from edge (a) on FIG. 2b. A third metal layer (57) is next deposited on layer (56) and patterned to have a perimeter (d) at a distance of 2.5 to 3.1 mm from edge (a) in FIG. 2b.

Finally, the whole wafer shown in FIG. 2a is encapsulated by depositing a passivation layer (58) over the previous layers whereby the edge of layer (58) ends commensurate with the edge (a) of substrate (10). It is preferred that layer (58) is a photosensitive dielectric material. Using the photosensitive property, a circumferential ring of passivation layer (58) is exposed to an ultraviolet light (not shown) that is held above the edge of wafer (10) held and rotated on a chuck. During the subsequent photographic development, the exposed areas of polyimide layer (58) are fixed, while masked areas such as scribe lines defining chip sites are dissolved. The resulting wafer edge exposure, or, WEE, ring then seals the edge of wafer (10) continuously around the circumference such that when backlapping the wafer as a final step, particulate contaminates from the grinding slurry are not allowed inside the edge of the wafer.

While the invention has been particularly shown and described with reference to the preferred embodiments thereof, it will be understood by those skilled in the art that various changes in form and details may be made without departing from the spirit and scope of the invention.

What is claimed is:

1. A method for providing a wafer edge seal ring structure, comprising the steps of:

providing a substrate;

depositing PolySi layer on said substrate;

forming a circumferential recess in said PolySi layer;

depositing a first interlevel dielectric layer on said PolySi layer;

forming a circumferential recess in said first level dielectric layer;

depositing a first metal layer on said first interlevel layer;

forming a circumferential recess in said first metal layer;

depositing a second interlevel dielectric layer on said first metal layer;

forming a circumferential recess in said second interlevel dielectric layer;

depositing a second metal layer on said second interlevel dielectric layer;

forming a circumferential recess in said second metal layer;

depositing a third interlevel dielectric layer on said second metal layer;

forming a circumferential recess in said third interlevel dielectric layer;

depositing a third metal layer on said third interlevel dielectric layer;

forming a circumferential recess in said third metal layer; and depositing a passivation layer.

2. The method of claim 1, wherein said substrate is silicon.

3. The method of claim 2, wherein said substrate contains semiconductor devices.

4. The method of claim 1, wherein said circumferential recess in said PolySi is formed at a distance between about 1.6 to 2.0 mm from edge of said substrate.

5. The method of claim 1, wherein said first interlevel dielectric layer is BPTEOS.

6. The method of claim 5, wherein said first BPTEOS has a thickness between about 9,000 to 10,000 Å.

7. The method of claim 1, wherein said circumferential recess in said first interlevel dielectric is formed at a distance between about 1.0 to 1.5 mm. from edge of said substrate.

8. The method of claim 1, wherein said first metal layer is aluminum-copper.

9. The method of claim 8, wherein said first metal layer has a thickness between about 5,000 to 5,600 Å.

10. The method of claim 1, wherein said circumferential recess in said first metal layer is formed at a distance between about 2.5 to 3.1 mm from edge of said substrate.

11. The method of claim 1, wherein said second interlevel dielectric layer is a sandwich dielectric structure.

12. The method of claim 11, wherein said sandwich dielectric structure has a thickness between about 8,000 to 10,000 Å.

13. The method of claim 1, wherein said circumferential recess in said second interlevel dielectric is formed at a distance between about 2.0 to 2.6 mm from edge of said substrate.

14. The method of claim 1, wherein said second metal layer is aluminum-copper.

15. The method of claim 14, wherein said second metal layer has a thickness between about 5,000 to 6,000 Å.

16. The method of claim 1, wherein said circumferential recess in said second metal layer is formed at a distance between about 1.5 to 2.0 mm from edge of said substrate.

17. The method of claim 1, wherein said third interlevel dielectric layer is SOG.

18. The method of claim 17, wherein said third SOG layer has a thickness between about 8,000 to 10,000 Å.

19. The method of claim 1, wherein said circumferential recess in said third interlevel dielectric is formed at a distance between about 3.0 to 3.5 from edge of said substrate.

20. The method of claim 1, wherein said third metal layer is aluminum-copper.

21. The method of claim 20, wherein said third metal layer has a thickness between about 8,000 to 8,200 Å.

22. The method of claim 1, wherein said circumferential recess in said third metal layer is formed at a distance between about 2.5 to 3.1 mm. from edge of said substrate.

23. The method of claim 1, wherein said passivation layer is a photosensitive polyimide.

24. The method of claim 23, wherein said polyimide layer has a thickness between about 3.0 micrometers.

* * * * *